(12) United States Patent
Kwon et al.

(10) Patent No.: US 9,269,568 B2
(45) Date of Patent: Feb. 23, 2016

(54) METHOD OF MANUFACTURING SEMICONDUCTOR DEVICE USING THE SAME

(71) Applicant: WONIK IPS CO., LTD., Pyeongtaek-Si, Gyeonggi-Do (KR)

(72) Inventors: Young Soo Kwon, Hwaseong-Si (KR); Kyoung Pil Na, Incheon (KR); Seok Jong Hyun, Daejeon (KR)

(73) Assignee: WONIK IPS CO., LTD (KR)

( * ) Notice: Subject to any disclaimer, the term of this patent is extended or adjusted under 35 U.S.C. 154(b) by 0 days.

(21) Appl. No.: 14/324,064

(22) Filed: Jul. 3, 2014

(65) Prior Publication Data

US 2014/0322920 A1 Oct. 30, 2014

Related U.S. Application Data

(63) Continuation of application No. 12/842,840, filed on Jul. 23, 2010, now abandoned.

(30) Foreign Application Priority Data

Jul. 27, 2009 (KR) .......................... 10-2009-0068189

(51) Int. Cl.

| | |
|---|---|
| *H01L 21/02* | (2006.01) |
| *C23C 16/30* | (2006.01) |
| *C23C 16/452* | (2006.01) |
| *C23C 16/50* | (2006.01) |
| *H01J 37/32* | (2006.01) |
| *H01L 21/314* | (2006.01) |

(Continued)

(52) U.S. Cl.

CPC .......... *H01L 21/02274* (2013.01); *C23C 16/30* (2013.01); *C23C 16/308* (2013.01); *C23C 16/452* (2013.01); *C23C 16/50* (2013.01); *H01J 37/321* (2013.01); *H01J 37/32357* (2013.01); *H01J 37/32449* (2013.01); *H01L 21/022* (2013.01); *H01L 21/0214* (2013.01); *H01L 21/0217* (2013.01); *H01L 21/02126* (2013.01); *H01L 21/3145* (2013.01); *H01L 21/3185* (2013.01); *H01L 21/31633* (2013.01); *H01L 21/76832* (2013.01); *H01L 21/76834* (2013.01)

(58) Field of Classification Search
CPC ............ H01L 29/7869; H01L 21/0228; H01L 27/1225; H01L 21/02274; H01L 21/02211; H01L 2924/00; H01L 2924/0002; H01L 21/02164
See application file for complete search history.

(56) References Cited

U.S. PATENT DOCUMENTS

| 6,025,222 A | 2/2000 | Kimura et al. |
|---|---|---|
| 2003/0036268 A1 | 2/2003 | Brabant et al. |

(Continued)

FOREIGN PATENT DOCUMENTS

| CN | 1219764 | 6/1999 |
|---|---|---|
| JP | 06029230 | 2/1994 |
| JP | 06132278 | 5/1994 |
| JP | 2008091805 | 4/2008 |
| KR | 20010094961 A | 11/2001 |

(Continued)

*Primary Examiner* — Tony Tran (57) ABSTRACT

Provided are a deposition apparatus and a method of manufacturing a semiconductor device. In the method, a reaction chamber provided with a gaseous source supply unit and a liquid source supply unit is prepared, and an etch stop layer is formed on a substrate by using a gaseous source. Then, an interlayer insulation layer is formed on the etch stop layer by using a vaporized liquid source and a vaporized dopant source. In this way, the etch stop layer and the interlayer insulation layer are formed in-situ in the same reaction chamber.

4 Claims, 5 Drawing Sheets

(51) Int. Cl.
*H01L 21/316* (2006.01)
*H01L 21/318* (2006.01)
*H01L 21/768* (2006.01)

(56) References Cited

U.S. PATENT DOCUMENTS

2003/0162412 A1* 8/2003 Chung .................... 438/791
2005/0233595 A1 10/2005 Choi et al.
2008/0314520 A1* 12/2008 Chiba et al. ............. 156/345.1

FOREIGN PATENT DOCUMENTS

| KR | 20050044797 A | 5/2005 |
| KR | 20060088324 A | 8/2006 |
| KR | 100744528 B1 | 7/2007 |
| KR | 20080025109 A | 3/2008 |
| TW | 554442 | 9/2003 |
| TW | 200814157 A | 3/2008 |
| TW | 200913066 A | 3/2009 |
| WO | 2006023501 A2 | 3/2006 |

* cited by examiner

METHOD OF MANUFACTURING SEMICONDUCTOR DEVICE USING THE SAME

CROSS-REFERENCE TO RELATED APPLICATIONS

This application is a continuation of U.S. patent application Ser. No. 12/842,840, filed on Jul. 23, 2010, which claims priority to Korean Patent Application No. 10-2009-0068189 filed on Jul. 27, 2009 and all the benefits accruing therefrom under 35 U.S.C. §119, the contents of which are incorporated by reference in their entirety.

BACKGROUND

The present disclosure relates to a deposition apparatus and a method of manufacturing a semiconductor device using the same. More particularly, the present disclosure relates to a deposition apparatus in which different layers can be formed in-situ by using a gaseous source and a liquid source, and a method of manufacturing a semiconductor device.

As recent semiconductor devices are highly integrated and operate at high speeds, fine and multi-layered interconnections are used in the semiconductor devices. In addition, copper is used as an interconnection material, and materials having a low dielectric constant (k) are used as insulation layer materials so as to reduce RC signal delays. Moreover, difficulties in metal patterning caused by design rule reduction have led to the development of a damascene process in which metal etching and insulation layer gap filling are not performed in an interconnection forming process.

In a damascene process, an etch stop layer and an interlayer insulation layer are formed on a substrate on which a predetermined structure is formed, and predetermined regions of the interlayer insulation layer are etched until the etch stop layer is exposed. Then, the exposed etch stop layer is etched to form holes or trenches. Thereafter, the holes or trenches are filled with a metal layer to form metal interconnections. At this time, the etch stop layer is formed of a material the etching rate of which is different from the etching rate of a material used for forming the interlayer insulation layer. For example, the interlayer insulation layer may be formed of a silicon oxide, and the etch stop layer may be formed of a silicon nitride (SiN).

In this case, the etch stop layer such as a silicon nitride layer is formed by using a gaseous source, and the interlayer insulation layer is formed by using a liquid source. Thus, it is necessary to form the etch stop layer and the interlayer insulation layer in different deposition apparatuses: a gaseous-source deposition apparatus and a liquid-source deposition apparatus. In this case, however, equipment may not be operated usefully and compatibly, and the productivity of the equipment may be lowered.

SUMMARY

The present disclosure provides a deposition apparatus in which different layers can be formed in-situ by using a gaseous source and a liquid source, and a method of manufacturing a semiconductor device.

The present disclosure also provides a deposition apparatus in which an etch stop layer and an interlayer insulation layer can be formed in-situ by using a gaseous source and a liquid source, respectively, and a method of manufacturing a semiconductor device.

In accordance with an exemplary embodiment, a deposition apparatus includes: a reaction chamber in which a reaction space is formed; a substrate support and a shower head disposed in the reaction chamber to face each other; a gaseous source supply unit connected to the shower head to supply a gaseous source; a liquid source supply unit installed to be separated from the gaseous source supply unit and connected to the shower head to supply a liquid source; and a reaction gas supply unit installed to be separated from the gaseous source supply unit and the liquid source supply unit and connected to the shower head to supply a reaction gas.

The gaseous source supply unit may include a gaseous source supply pipe connected to the shower head, and the liquid source supply unit may include a liquid source supply pipe connected to the shower head, wherein the gaseous source supply pipe may be disposed in the liquid source supply pipe.

The deposition apparatus may further include: a first plasma generating unit disposed at at least one of an upper part and a side part of the reaction chamber; and a second plasma generating unit connected to a part of the reaction gas supply unit.

In accordance with another exemplary embodiment, there is provided a method of manufacturing a semiconductor device by using a deposition apparatus in which a gaseous source supply unit configured to supply a gaseous source, a liquid source supply unit configured to supply a liquid source and a dopant source, and a reaction gas supply unit configured to supply a reaction gas are installed to be separated from each other and connected to a reaction chamber in which a reaction space is formed, the method includes: forming an etch stop layer on a substrate by using the gaseous source; and forming an interlayer insulation layer on the etch stop layer by vaporizing the liquid source, supplying the vaporized liquid source into the reaction chamber, and supplying the dopant source into the reaction chamber, wherein the etch stop layer and the interlayer insulation layer are formed in-situ in the reaction chamber.

The method may further include forming a liner on the etch stop layer by using reaction gas radicals and the vaporized liquid source.

The method may further include forming a liner on the substrate by using reaction gas radicals and the vaporized liquid source, or by using a pretreatment process.

The etch stop layer, the liner, and the interlayer insulation layer may be formed in-situ in the reaction chamber.

In accordance with yet another exemplary embodiment, there is provided a method of manufacturing a semiconductor device, the method including: preparing a reaction chamber provided with a gaseous source supply unit, a liquid source supply unit, and a reaction gas supply unit; loading a substrate into the reaction chamber; forming an etch stop layer on the substrate by supplying a gaseous source from the gaseous source supply unit; after interrupting the supplying of the gaseous source, supplying a vaporized liquid source from the liquid source supply unit, and supplying a reaction gas from the reaction gas supply unit while applying an electric field to the reaction gas supply unit to generate reaction gas radicals; forming a liner on the etch stop layer by introducing the reaction gas radicals and the vaporized liquid source into the reaction chamber; and forming an interlayer insulation layer on the liner by supplying the vaporized liquid source and a vaporized dopant source from the liquid source supply unit as interrupting the supplying of the reaction gas and the applying of the electric field.

The electric field may be generated using a plasma generating unit connected to the reaction gas supply unit.

After the forming of the interlayer insulation layer, the method may further include removing unreacted gas from the reaction chamber by using a cleaning gas supplied from the reaction gas supply unit.

The cleaning gas may be the same as the reaction gas.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. Like reference numerals refer to like elements throughout. It will also be understood that when a layer, a film, a region or a plate is referred to as being 'on' another one, it can be directly on the other one, or one or more intervening layers, films, regions or plates may also be present. Further, it will be understood that when a layer, a film, a region or a plate is referred to as being 'under' another one, it can be directly under the other one, and one or more intervening layers, films, regions or plates may also be present. In addition, it will also be understood that when a layer, a film, a region or a plate is referred to as being 'between' two layers, films, regions or plates, it can be the only layer, film, region or plate between the two layers, films, regions or plates, or one or more intervening layers, films, regions or plates may also be present.

Figure 1:
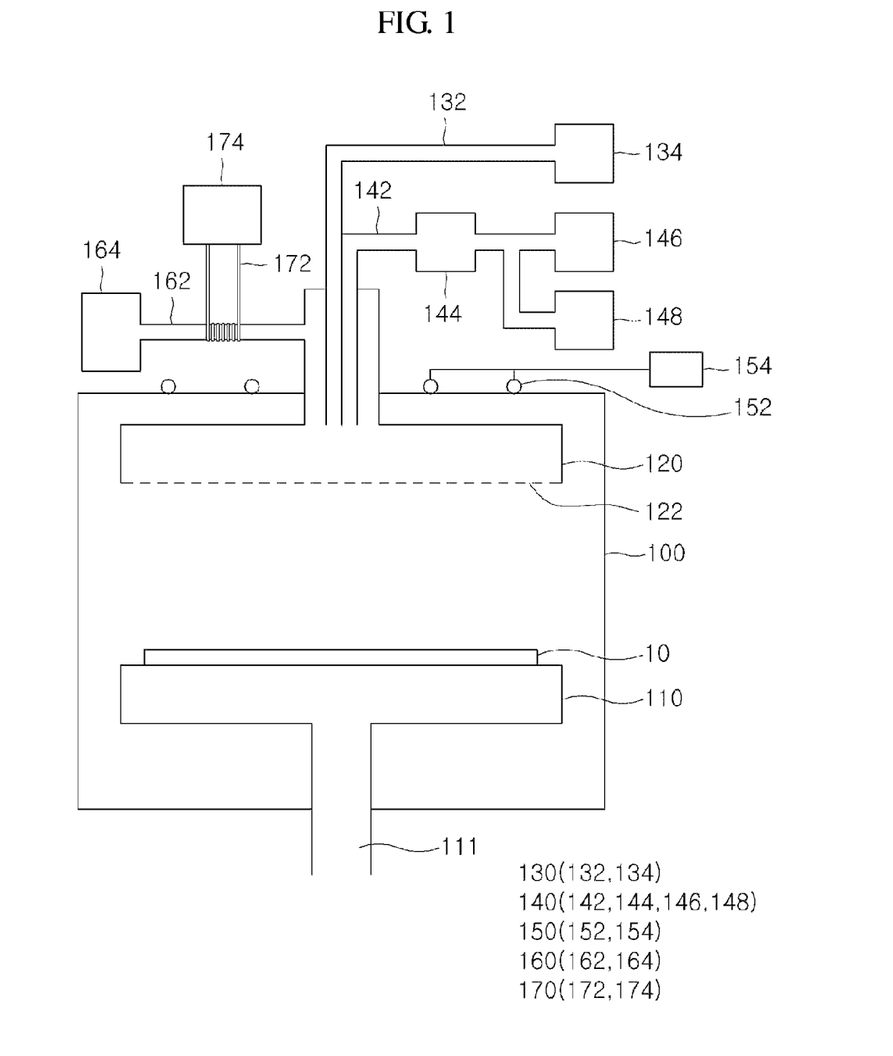
FIG. 1 is a schematic sectional view illustrating a deposition apparatus in accordance with an exemplary embodiment.

FIG. 1 is a schematic sectional view illustrating a deposition apparatus that may be used for a method of manufacturing a semiconductor device in accordance with an exemplary embodiment. For example, the deposition apparatus is a chemical vapor deposition (CVD) apparatus such as a plasma enhanced CVD (PECVD) apparatus.

Referring to FIG. 1, the CVD apparatus of the current embodiment includes: a reaction chamber 100 in which a reaction spaced is formed; a substrate support 110 disposed in a lower inner side of the reaction chamber 100 to support a substrate 10; a shower head 120 disposed at an upper inner side of the reaction chamber 100 and facing the substrate support 110 to inject a supply gas; a gaseous source supply unit 130 configured to supply a gaseous source to the shower head 120; a liquid source supply unit 140 configured to supply a liquid source to the shower head 120 after vaporizing the liquid source; a first plasma generating unit 150 configured to excite the gaseous source and liquid source; a reaction gas supply unit 160 configured to supply a reaction gas to the shower head 120; and a second plasma generating unit 170 configured to excite the reaction gas.

The reaction chamber 100 provides an airtight reaction region. The reaction chamber 100 may include: a reaction part constituted by a flat part having an approximately circular shape and a sidewall part extending upward from the flat part to form a predetermined space; and a circular cover having an approximately circular shape and disposed on the reaction part to keep the reaction chamber 100 airtight. The reaction part and the cover may have other shapes such as a shape corresponding to the shape of a substrate 10.

The substrate support 110 is disposed at a lower side of the reaction chamber 100 to face the shower head 120. For example, the substrate support 110 may include an electrostatic chuck to receive a substrate 10 carried into the reaction chamber 100. The substrate support 110 may have an approximately circular shape or any other shape corresponding to the shape of a substrate 10. The size of the substrate support 110 may be greater than that of a substrate 10. A substrate elevator 111 is disposed under the substrate support 110 to raise or lower a substrate 10 placed on the substrate support 110. If a substrate 10 is placed on the substrate support 110, the substrate elevator 111 moves the substrate 10 close to the shower head 120. In addition, a heater (not shown) is disposed in the substrate support 110. The heater heats a substrate 10 so that layers such as an etch stop layer and an interlayer insulation layer may be easily formed on the substrate 10 by depositing a gaseous source and a liquid source. A cooling conduit (not shown) may also be disposed in the substrate support 110 in addition to the heater. A coolant may be circulated through the cooling conduit disposed in the substrate support 110 to cool a substrate 10 by conduction between the substrate 10 and the substrate support 110 for adjusting the temperature of the substrate 10 to a desired level.

The shower head 120 is disposed at an upper side in the reaction chamber 100 to face the substrate support 110 to inject a gaseous source, a liquid source, and a reaction gas toward the lower side of the reaction chamber 100. The upper part of the shower head 120 is connected to the gaseous source supply unit 130, the liquid source supply unit 140, and the reaction gas supply unit 160, and a plurality of injection holes 122 are formed in the bottom side of the shower head 120 to inject a source gas and a reaction gas. The shower head 120 has an approximately circular shape or any other shape corresponding to the shape of a substrate 10. The size of the shower head 120 may be equal to the size of the substrate support 110.

The gaseous source supply unit 130 includes a gaseous source supply pipe 132 connected to the upper part of the shower head 120 to supply a gaseous source to the shower head 120; and a gaseous source storing part 134 configured to store a gaseous source. The gaseous source storing part 134 stores a source used to form an etch stop layer such as a silicon nitride layer. For example, the gaseous source storing part 134 stores a silicon source such as $SiH_4$ and a nitrogen source such as $NH_3$. Thus, the gaseous source storing part 134 may include a silicon source storing part and a nitrogen source storing part. For example, a dopant such as carbon may be added to an etch stop layer. In this case, a dopant source storing part may be additionally provided.

The liquid source supply unit 140 is connected to the upper part of the shower head 120 and supplies a liquid source to the shower head 120 after vaporizing the liquid source. The liquid source supply unit 140 may include: a liquid source supply pipe 142 separated from the gaseous source supply pipe 132 and configured to supply a vaporized liquid source to the shower head 120; a vaporizer 144 configured to vaporize a liquid source; a liquid source storing part 146 configured to store a liquid source; and a dopant source storing part 148 configured to store a dopant source. The liquid source stored in the liquid source storing part 146 is vaporized by the vaporizer 144 and is supplied to the shower head 120 through the liquid source supply pipe 142. Like the liquid source, the dopant source stored in the dopant source storing part 148 is supplied to the shower head 120 through the vaporizer 144 and the liquid source supply pipe 142 and is then injected through the shower head 120. If a gaseous dopant source is used, the vaporizer 144 may be disposed only at a side of the liquid source storing part 146 to vaporize only the liquid source. The liquid source storing part 146 stores tetraethylorthosilicate (TEOS) and $O_2$ as main sources for forming an interlayer insulation layer such as a silicon oxide ($SiO_2$) layer. For this, the liquid source storing part 146 may be divided into a TEOS storing part and a $O_2$ storing part. In the case where a dopant is added to an interlayer insulation layer, for example, to form a SiOCH layer, the dopant source storing part 148 a carbon-containing source such as $CH_4$. Like the liquid source storing part 146, the dopant source storing part 148 may be divided into a plurality of storing parts to store a plurality of dopants. The liquid source storing part 146 and the dopant source storing part 148 are connected to the liquid source supply pipe 142 through valves (not shown) to control supplies of the liquid source and the dopant source.

The first plasma generating unit 150 is configured to excite a gaseous source and a liquid source into a plasma state. The first plasma generating unit 150 includes: a first plasma generating coil 152 disposed at an upper or side part of the reaction chamber 100 or first plasma generating coils 152 disposed at both the upper and side parts of the reaction chamber 100; and a first power supply part 154 configured to supply power to the first plasma generating coil(s) 152. In the case where first plasma generating coils 152 are disposed at the upper and side parts of the reaction chamber 100, the first plasma generating coils 152 may be connected in parallel. The first plasma generating coil 152 disposed at the upper part of the reaction chamber 100 may have an outer diameter greater than the shower head 120 so as to completely ionize a liquid source and a gaseous source injected through the shower head 120.

The reaction gas supply unit 160 includes: a reaction gas supply pipe 162 separated from the gaseous source supply pipe 132 and the liquid source supply pipe 142 and connected to the upper part of the shower head 120 to supply a reaction gas to the shower head 120; and a reaction gas storing part 164 configured to store a reaction gas. The reaction gas storing part 164 is configured to store a reaction gas for depositing a liner between an etch stop layer and an interlayer insulation layer. For example, the reaction gas storing part 164 stores a nitrogen-containing gas such as $NH_3$, a carbon-containing gas such as $CH_4$, an inert gas, or a mixture thereof. According to the number of reaction gases to be stored, a plurality of reaction gas storing parts 164 may be provided. In addition, the reaction gas storing part 164 may store a cleaning gas to purge a unreacted gas after an interlayer insulation layer is deposited. A gas such as an inert gas may be used as a cleaning gas. Thus, if an inert gas such as a nitrogen-containing gas is stored in the reaction gas storing part 164, the inert gas may be used as a reaction gas when a liner is deposited and as a cleaning gas to purge an unreacted gas after an interlayer insulation layer is deposited.

The second plasma generating unit 170 is configured to generate radicals by exciting a reaction gas supplied through the reaction gas supply unit 160 into a plasma state. The second plasma generating unit 170 includes a second plasma generating coil 172 disposed at a predetermined part of the reaction gas supply pipe 162, and a second power supply part 174 configured to supply power to the second plasma generating coil 172. If power is supplied from the second power supply part 174 to the second plasma generating coil 172, an electric field is generated, and a reaction gas is excited into a plasma state by the electric field, so that reaction gas radicals can be generated. For example, if $NH_3$ is used as a reaction gas, nitrogen radicals (N*) are generated, and if $CH_4$ is used as a reaction gas, carbon radicals (C*) are generated. That is, various radicals may be generated according to the kind of a reaction gas. Such reaction gas radicals are injected through the shower head 120 together with a vaporized liquid source, and a liner is formed on a substrate 10 by a reaction between the vaporized liquid source and the reaction gas radicals. For example, if vaporized TEOS and $O_2$ are supplied as sources and $NH_3$ is supplied as a reaction gas, a SiON liner may be deposited. In addition, if vaporized TEOS and $O_2$ are supplied as sources and $CH_4$ is supplied as a reaction gas, a SiOCH liner may be deposited. In addition, if vaporized TEOS and $O_2$ are supplied as sources and $NH_3$ and $CH_4$ are supplied as reaction gases, a SiOCN liner may be deposited. That is, various liners may be deposited according to the kind of a reaction gas.

Figure 2:
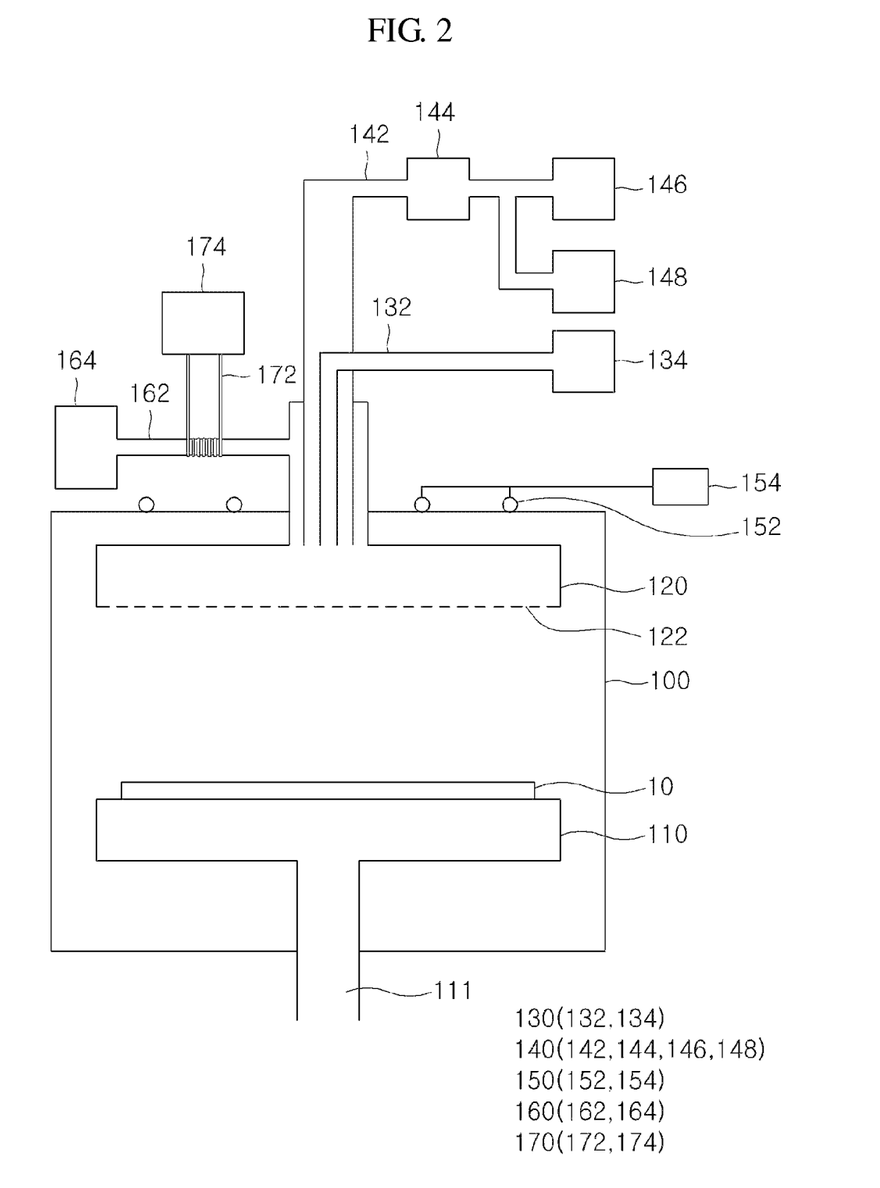
FIG. 2 is a schematic sectional view illustrating a deposition apparatus in accordance with another exemplary embodiment.

FIG. 2 is a schematic sectional view illustrating a deposition apparatus in accordance with another exemplary embodiment.

Referring to FIG. 2, in the deposition apparatus of the current embodiment, a liquid source supply pipe 142 has a diameter greater than that of a gaseous source supply pipe 132, and the gaseous source supply pipe 132 is disposed in the liquid source supply pipe 142.

Figure 3:
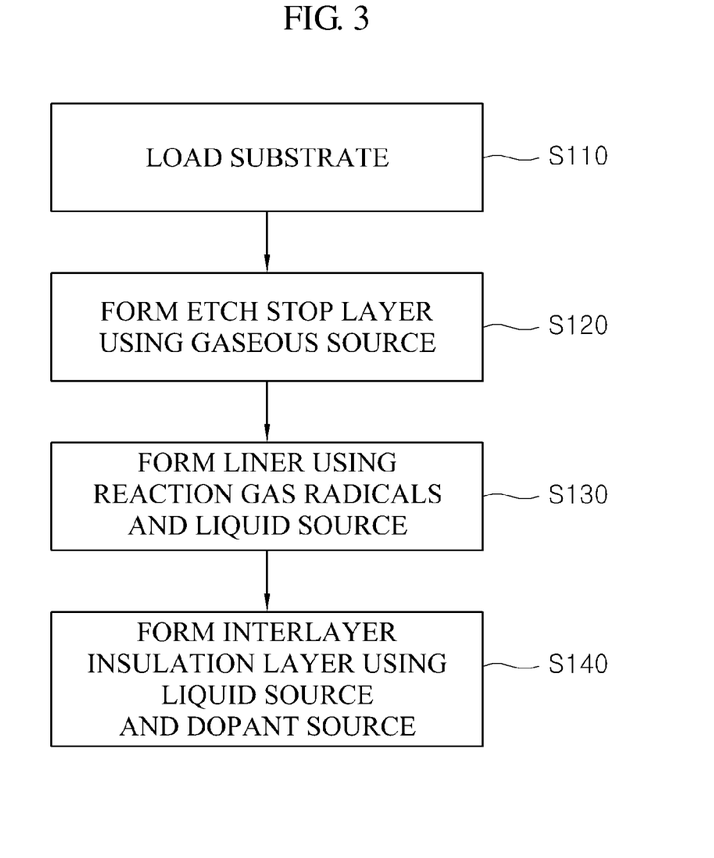
FIG. 3 is a flowchart for explaining a method of manufacturing a semiconductor device in accordance with an exemplary embodiment.

A method of manufacturing a semiconductor device by using the above-described CVD apparatus will now be explained with reference to FIGS. 3 through 7. FIG. 3 is a flowchart for explaining the method of manufacturing a semiconductor device in accordance with an exemplary embodiment, and FIGS. 4 through 7 are sectional views illustrating a device according to a process sequence.

Referring to FIG. 3, the semiconductor device manufacturing method of the current embodiment includes: an operation S110 in which a substrate 10 on which a predetermined structure is formed is loaded into the reaction chamber 100; an operation S120 in which a gaseous source is supplied from the gaseous source supply unit 130 to form an etch stop layer on the substrate 10; an operation S130 in which a reaction gas is excited into a plasma state to generate radicals and a vaporized liquid source is supplied so as to form a liner on the etch stop layer; and operation S140 in which supply of radicals is interrupted and vaporized liquid and dopant sources are supplied to form an interlayer insulation layer on the liner.

With reference to the flowchart of FIG. 3 and the sectional views of FIGS. 4 through 7, the semiconductor device manufacturing method of the current embodiment will be now explained in more detail.

Figure 4:
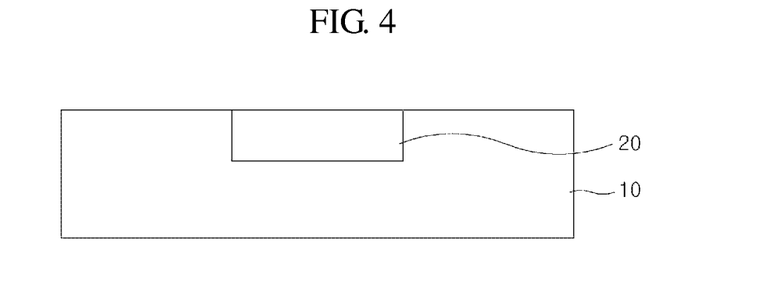
FIGS. 4 through 7 are sectional views for explaining the semiconductor device manufacturing method.

S110: as shown in FIGS. 3 and 4, a substrate 10 on which a predetermined structure is formed is loaded into the reaction chamber 100. For example, transistors, bit lines, and metal interconnections may be formed on the substrate 10. In the current embodiment, an exemplary metal interconnection 20 is formed on the substrate 10. When the substrate 10 on which the metal interconnection 20 is loaded into the reaction chamber 100, the substrate 10 is placed on the substrate support 110, and the substrate elevator 111 moves upward to adjust the gap between the substrate support 110 and the shower head 120.

Figure 5:
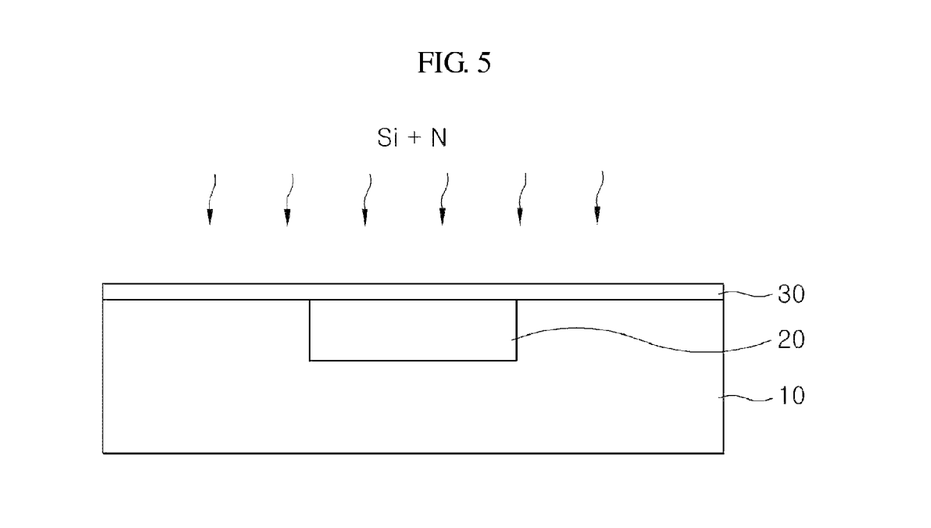

S120: as shown in FIGS. 3 and 5, the substrate 10 is kept at a predetermined temperature, for example, in the range from approximately 400° C. to approximately 550° C. by using the heater disposed in the substrate support 110, and the inside of the reaction chamber 100 is kept at a predetermined pressure, for example, vacuum pressure. Next, a gaseous source stored in the gaseous source storing part 134, such as a silicon source and a nitrogen source, is supplied to the shower head 120 through the gaseous source supply pipe 132, and then the gaseous source is injected to the substrate 10 through the shower head 120. At this time, plasma is generated by the operation of the first plasma generating unit 150. Thus, a layer such as a silicon nitride layer is formed on the substrate 10 as an etch stop layer 30.

Figure 6:
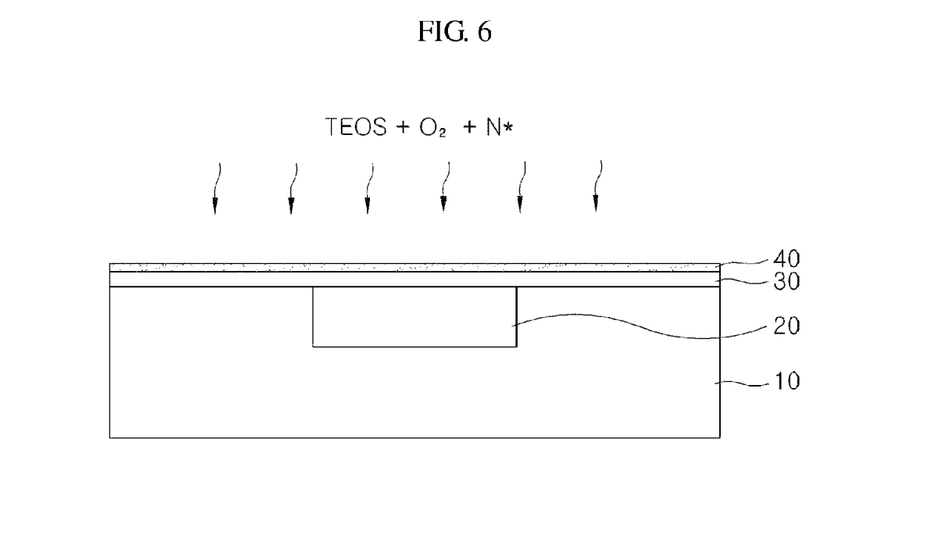

S130: as shown in FIGS. 3 and 6, supply of the gaseous source from the gaseous source supply unit 130 is interrupted. Then, a vaporized liquid source is supplied from the liquid source supply unit 140, and while supplying a reaction gas through the reaction gas supply unit 160, the reaction gas is excited by the second plasma generating unit 170 to generate reaction gas radicals. At this time, plasma is generated in the reaction chamber 100 by the first plasma generating unit 150. That is, a liquid source such as TEOS and $O_2$ is supplied from the liquid source supply unit 140 while vaporizing the liquid source by using the vaporizer 144, and then the vaporized liquid source is supplied to the shower head 120 through the liquid source supply pipe 142. Along with this, a reaction gas such as $NH_3$ is supplied through the reaction gas supply pipe 162 from the reaction gas storing part 164. At this time, power is supplied to the second plasma generating coil 172 from the second power supply part 174 to generate an electric field. Thus, the reaction gas flowing in the reaction gas supply pipe 162 is excited into a plasma state to generate nitrogen radicals (N*). As a result, the nitrogen radicals (N*) and the vaporized liquid source are supplied to the shower head 120 where the nitrogen radicals (N*) and the vaporized liquid source (TEOS and $O_2$) are injected. Then, a liner 40 is formed on the etch stop layer 30. For example, a SiON layer may be deposited as the liner 40, and the thickness of the liner 40 may be determined by the supply amounts or times of the nitrogen radicals (N*) and the vaporized liquid source. Alternatively, if a carbon-containing gas is used as a reaction gas, a SiOCH layer may be deposited as the liner 40. Alternatively, if a gas containing carbon and nitrogen is used as a reaction gas, a SiOCN layer may be deposited as the liner 40. That is, various kinds of liners 40 may be deposited according to the kind of a reaction gas. The kind of a reaction gas for the liner 40 may be determined by the kinds of liquid source and dopant source used for forming an interlayer insulation layer, and owing to the use of radicals, the liner 40 may have a denser structure to prevent permeation of impurities.

Figure 7:
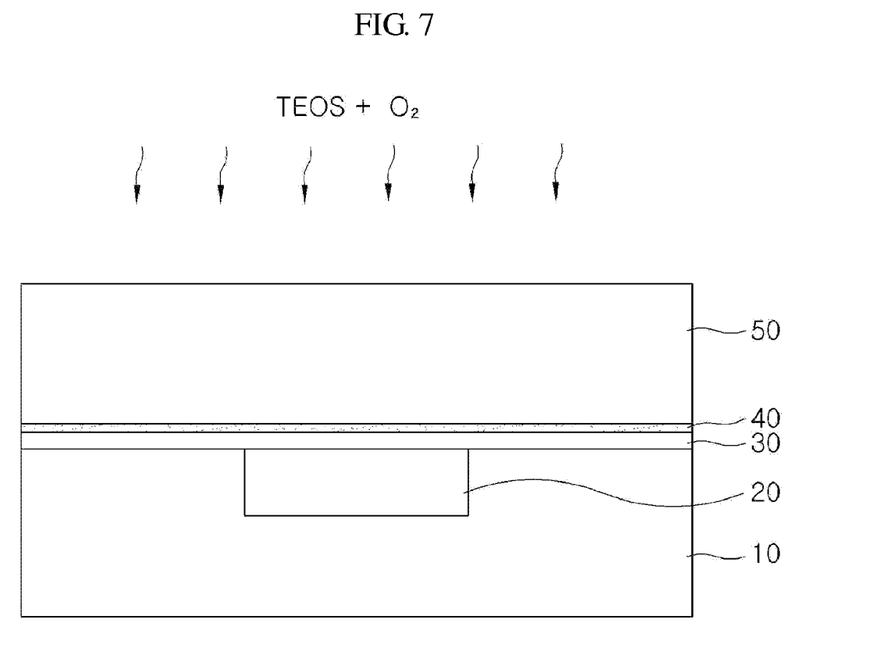

S140: referring to FIGS. 3 and 7, supply of the reaction gas from the reaction gas supply unit 160 is interrupted, and power supply from the second power supply part 174 is also interrupted. However, the liquid source vaporized by the vaporizer 144 is continuously supplied to the shower head 120 to inject the vaporized liquid source. At this time, the first plasma generating unit 150 is also operated to generate plasma in the reaction chamber 100. As a result, an interlayer insulation layer 50 is deposited on the liner 40 of the substrate 10. The interlayer insulation layer 50 may be a silicon oxide layer. If necessary, a dopant source is supplied from the dopant source storing part 148 to alter the interlayer insulation layer 50. For example, a carbon source may be supplied as a dopant source to form a SiOCH layer as the interlayer insulation layer 50.

After the deposition of the interlayer insulation layer 50, unreacted gases remaining in the reaction chamber 100 are purged. For this, supplies of the liquid source and the dopant source are interrupted, and a gas such as $NH_3$ or inert gas is supplied from the reaction gas supply unit 160 as a cleaning gas.

In the above-described embodiment, a silicon source and a nitride source are used to form a silicon nitride layer as an etch stop layer; TEOS and $O_2$ are used as a liquid source and $NH_3$ is used as a reaction gas to form a SiON layer as a liner; and TEOS and $O_2$ are used as a liquid source to form a silicon oxide layer as an interlayer insulation layer. However, the present invention is not limited thereto. That is, various sources may be used to form various etch stop layers, liners, and interlayer insulation layers. In this case, the kind of an etch stop layer may be determined according to the kind of an interlayer insulation layer, and accordingly a material for a liner may be determined according to the kinds of the interlayer insulation layer and the etch stop layer.

In the above-described embodiment, the liner is formed on the etch stop layer. However, the liner may be formed before the etch stop layer is formed. The liner may be formed by using radicals as described or through a pretreatment.

In the above-described embodiment, the second plasma generating unit is used to generate reaction gas radicals. However, the second plasma generating unit may not be used. In this case, a reaction gas may be ionized in the reaction chamber by the first plasma generating unit.

In the above-described embodiment, an explanation has been given on the case of using a PECVD apparatus. However, the present invention may be applied to other CVD apparatuses such as a sub-atmospheric chemical vapor deposition (SACVD) apparatus.

As described above, both the gaseous source supply unit and the liquid source supply unit are provided for the reaction chamber, and after an etch stop layer is formed on a substrate by using a gaseous source, an interlayer insulation layer is formed on the etch stop layer by using vaporized liquid and dopant sources.

That is, an etch stop layer and an interlayer insulation layer can be formed in-situ in the same reaction chamber by using a gaseous source and a liquid source.

Therefore, equipment can be operated usefully and compatibly, and productivity can be improved.

Although the deposition apparatus and the semiconductor device manufacturing method have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A method of manufacturing a semiconductor device by using a deposition apparatus in which a gaseous source supply unit configured to store and supply a silicon-containing gaseous source and a nitrogen source each in a respective storing part, and a liquid source supply unit configured to store and supply a silicon-containing liquid source, an oxygen source, and a carbon-containing dopant source in a respective storing part are installed to be separated from each other and connected to a reaction chamber in which a reaction space is formed, the method comprising:
forming an etch stop layer on a substrate by supplying the silicon-containing gaseous source and the nitrogen source from the gaseous source supply unit into the reaction chamber; and forming an interlayer insulation layer on the etch stop layer by vaporizing the silicon-containing liquid source from the liquid source supply unit, supplying the vaporized silicon-containing liquid source, the oxygen source, and the dopant source into the reaction chamber, wherein the etch stop layer and the interlayer insulation layer are formed in-situ in the reaction chamber: and wherein the silicon-containing gaseous source is a gas containing $SiH_4$ and the nitrogen, the silicon-containing liquid source includes tetraethylorthosilicate (TEOS), and the reactive gas is carbon-containing gas or nitrogen-containing gas; and the deposition apparatus further includes a reaction gas supply unit configured to store and supply a reaction gas, the method further comprising forming a liner on the etch stop layer by supplying the reaction gas from the reaction gas supply unit, the vaporized silicon-containing liquid source, and the oxygen source from the liquid source supply unit into the reaction chamber.

2. The method of claim 1, wherein the etch stop layer, the liner, and the interlayer insulation layer are formed in-situ in the reaction chamber.

3. The method of claim 1, the deposition apparatus further including a reaction gas supply unit configured to store and supply a reaction gas, the method further comprising forming a liner on the substrate by supplying reaction gas from the reaction gas supply unit, the vaporized silicon-containing liquid source, and the oxygen source from the liquid source supply unit into the reaction chamber.

4. The method of claim 3, wherein the liner, the etch stop layer, and the interlayer insulation layer are formed consecutively in-situ in the reaction chamber.

* * * * *